United States Patent [19]

Collins

[11] Patent Number: 4,564,802

[45] Date of Patent: Jan. 14, 1986

[54] TEST DEVICE FOR FUSES AND BATTERIES

[76] Inventor: George G. Collins, P.O. Box 1396, Medina, Tex. 78055

[21] Appl. No.: 514,103

[22] Filed: Jul. 15, 1983

[51] Int. Cl.$^4$ ............................................. G01R 31/00
[52] U.S. Cl. ....................................... 324/51; 324/133
[58] Field of Search ........................... 324/51, 52, 133; 340/638, 639

[56] References Cited

U.S. PATENT DOCUMENTS 2,794,167  5/1957  Jones ..................................... 324/53
3,004,217  10/1961  Ciardiello ............................... 324/53

*Primary Examiner*—Stanley T. Krawczewicz
*Assistant Examiner*—Jose M. Solis
*Attorney, Agent, or Firm*—John C. Stahl

[57] ABSTRACT

A test device having a body including an electric bulb rated at 9 or 12 volts, illumination of the bulb being visible from outside the body; and at least two pairs of terminal stubs projecting from the body at regions spaced from each other, the members of each pair of terminal stubs being connected respectively to the terminals of the bulbs, the terminal stubs of one pair being spaced apart from each other by a first spacing of between 9 and 13 mm and the terminal stubs of the other or another pair being spaced apart from each other by a second spacing between 22 and 28 mm.

4 Claims, 6 Drawing Figures

TEST DEVICE FOR FUSES AND BATTERIES

CROSS-REFERENCE TO RELATED APPLICATION

The subject invention, first filed by applicant in Great Britain, Ser. No. 8222663 on Aug. 6, 1982 and entitled Test Device for Fuses and Batteries, is now UK Pat. No. GB 2124787B, issued on Oct. 3, 1984.

BACKGROUND OF THE INVENTION

The invention relates to a device for testing fuses and batteries. The fuses which the device is intended to test are motor-car fuses of the glass-tubular type or the more modern flat plastic type. The device is also suitable for testing 6 volt dry square lantern-type batteries or 9 volt rectangular dry cell batteries of the kind commonly used in radios, calculators, and the like.

SUMMARY OF THE INVENTION

According to the invention there is provided a test device having a body including an electric bulb rated at 12 volts, illumination of the bulb being visible from outside the body; and at least two pairs of terminal stubs projecting from the body at regions spaced from each other, the members of each pair of terminal stubs being connected respectively to the terminals of the bulb, the terminal stubs of one pair being spaced apart from each other by a first spacing of between 9 and 13 mm and the terminal stubs of the other or another pair being spaced apart from each other by a second spacing between 22 and 28 mm.

It is found that with two pairs of terminal stubs of this particular spacing, nearly all of the conventional sizes and types of motor-car fuses can be tested in situ. Also, 6 and 9 volt batteries of the type described above can readily be tested.

Preferably the body is slab-shaped and said two pairs of terminal stubs project from opposite edges of the slab. Preferably the body is made of plastics and encapsulates the bulb.

For testing batteries, the brightness of the bulb will depend upon the nominal voltage of the battery and its state of discharge. In order to assist judgement of the brightness of the bulb, it is proposed to make the two faces of the slab-shaped plastics body of different opacities.

In a particularly convenient form of construction for the device there are only two pairs of terminal stubs and these are constituted by the ends of conductor leads which run through the body and emerge at opposite sides with different spacings, the bulb terminals being connected to the conductor leads within the body.

DESCRIPTION OF PREFERRED EMBODIMENTS

Figure 1:
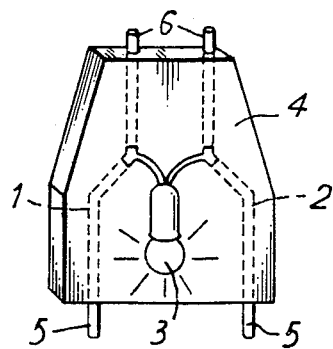
FIG. 1 is a pespective view of a test device in accordance with the invention.

Referring to FIG. 1, the device comprises a pair of copper wires 1, 2 of 1.5 mm diameter which have straight end sections and which are bent as shown. A twelve-volt incandescent electric bulb 3 has its terminals soldered to the wires 1 and 2 respectively. The whole assembly is encalsulated in a slab-shaped translucent white plastics body 4 in a molding operation. Of particular importance is the spacing of the wires 1 and 2 where they emerge from opposite edges of the slab-shaped body 4 to constitute pairs of projecting terminal stubs 5, 6. The members of pair 5 are spaced apart 25 mm and the members of pair 6 are spaced apart 11 mm.

Figure 2:
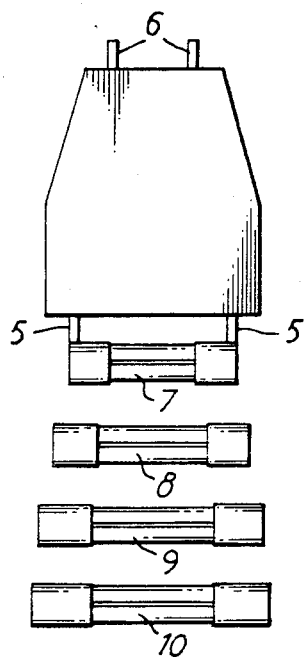
FIG. 2 is a view illustrating the application of the device of FIG. 1 to a first range of fuse sizes.
Figure 3:
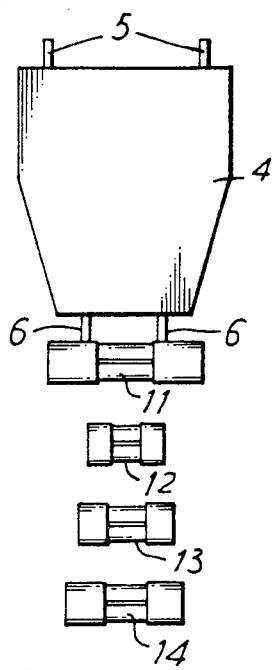
FIG. 3 is a view illustrating the application of the devce of FIG. 1 to a second range of fuse sizes.

FIGS. 2 and 3 show the significance of this spacing. In FIG. 2 there are shown four cartridge fuses 7 to 10 which are of such a size as to make it possible for the terminal stubs of pair 5 to contact the fuse end caps. In FIG. 3 there are four other fuses indicated at 11 to 14. These are of such a size that their end caps may be contacted by terminal stubs 6.

Figure 4:
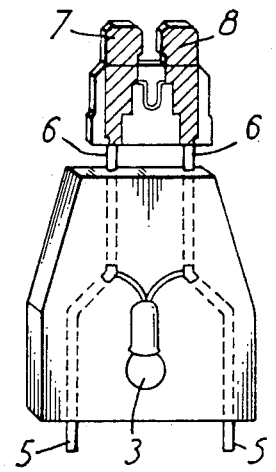
FIG. 4 is an illustration of application of the device of FIG. 1 to a flat plastic-type fuse of the modern kind.

Furthermore, FIG. 4 illustrates a flat-plastics fuse which has two terminal tabs 7, 8. Contact with these may be made by terminal stubs 6 while the fuse is in its fuse-holder.

The method of testing the fuses with the device of the present invention is to apply the approximate terminal stubs of the device to the fuse terminals while the fuse is in situ. If the fuse is carrying current then it will by-pass the bulb 3 and the bulb will not be illuminated. On the other hand, if the fuse is blown, then when an attempt is made to pass current through it, the bulb 3 will take the current and be illuminated.

Figure 5:
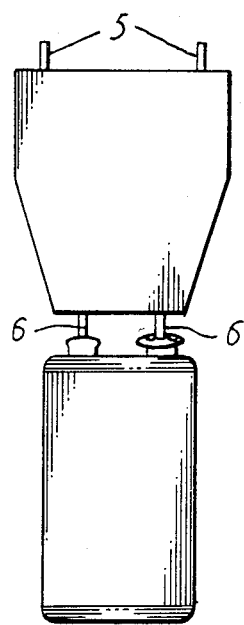
FIG. 5 is an illustration of application of the device of FIG. 1 to test a 9 volt battery.
Figure 6:
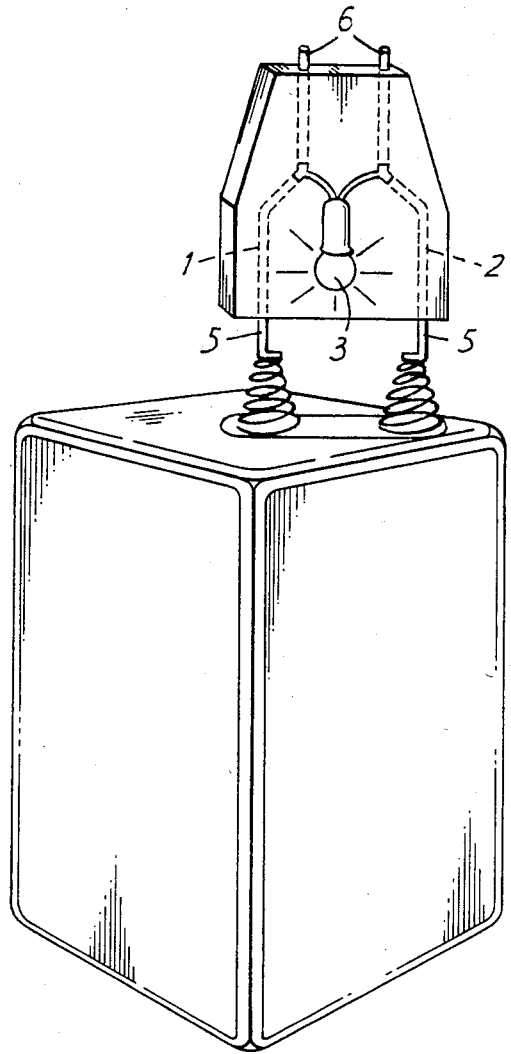
FIG. 6 is an illustration of application of the device of FIG. 1 to the testing of a 6 volt battery.

FIGS. 5 and 6 illustrate the use of the same device to test 9 or 6 volt batteries. Again, the spacing of terminal stubs 5 and 6 is appropriate to make contact with the terminals of the different batteries. Clearly, the bulb will glow if the battery has sufficient remaining charge.

In order to allow a quantitative estimation to be made of the intensity of illumination, and thus of the state of discharge of the battery, one face of the plastics body can be made of more opaque material so that the bulb can be seen through it only if the battery is fully charged. The other face of the body, however, can be relatively translucent, or transparent.

It should be understood, of course, that the foregoing disclosure relates to only preferred embodiments of the invention and that numerous modifications or alterations may be made therein without departing from the spirit and scope of the invention as set forth in the appended claims.

What is claimed is:

1. A test device comprising a translucent body, an electric bulb in said body adapted to be visible from outside said body upon illumination, and first and second pairs of terminals of electrically conductive material connected to said bulb and projecting at least slightly outwardly of said body, said first pair of terminals spaced apart from 9 to 13 mm, said second pair of terminals spaced apart from 22 to 28 mm, said second pair of terminals projecting from a selected portion of said body opposite to said first pair of terminals.

2. A test device of claim 1 wherein said first pair of terminals are substantially 11 mm apart, and said second pair of terminals are substantially 25 mm apart.

3. A test device of claim 1 wherein said body is composed of plastic and encapsulates said bulb.

4. A test device of claim 1 wherein said body is polygonally shaped, and one portion of said body is more translucent than the remainder.

* * * * *